United States Patent [19]

McPherson

[11] 4,077,927

[45] Mar. 7, 1978

[54] CURED EPOXY POLYMER HAVING IMPROVED ADHESIVE PROPERTIES

[75] Inventor: Charles Allen McPherson, Easthampton Township, Burlington County, N.J.

[73] Assignee: Western Electric Company, Incorporated, New York, N.Y.

[21] Appl. No.: 642,221

[22] Filed: Dec. 19, 1975

Related U.S. Application Data

[60] Division of Ser. No. 465,376, May 1, 1974, which is a continuation-in-part of Ser. No. 443,648, Feb. 19, 1974, abandoned, which is a continuation-in-part of Ser. No. 369,038, Jun. 11, 1973, abandoned.

[51] Int. Cl.$^2$ .............................................. C08L 63/00
[52] U.S. Cl. ......................... 260/23.7 N; 260/18 EP; 260/830 TW; 260/837 R; 428/417; 428/418
[58] Field of Search ............. 260/837, 23.7 N, 18 EP, 260/830 TW

[56] References Cited

U.S. PATENT DOCUMENTS

| | | | |
|---|---|---|---|
| 3,678,130 | 7/1972 | Klapprott | 260/837 R |
| 3,678,131 | 7/1972 | Klapprott | 260/837 R |
| 3,686,359 | 8/1972 | Soldatos | 260/836 |
| 3,707,583 | 12/1972 | McKown | 260/837 R |
| 3,823,107 | 7/1974 | Cotton | 260/837 R |
| 3,894,113 | 7/1975 | Pagel | 260/837 R |
| 3,926,903 | 12/1975 | Scola | 260/837 |
| 3,926,904 | 12/1975 | Scola | 260/837 R |
| 3,966,837 | 6/1976 | Riew | 260/837 R |

*Primary Examiner*—Paul Lieberman
*Attorney, Agent, or Firm*—J. Rosenstock

[57] ABSTRACT

A cured epoxy polymer having improved adhesive properties is disclosed. The epoxy polymer is the reaction product of a mixture comprising a resin component comprising (a) a diglycidyl ether based upon linoleic dimer acid, (b) an elastomerically modified epoxy resin blend and (c) a diglycidyl ether of bisphenol A and/or bisphenol F and a suitable curing agent. The reaction mixture is heated at a suitable temperature for a period of time sufficient to attain a full cure of the epoxy.

12 Claims, 1 Drawing Figure

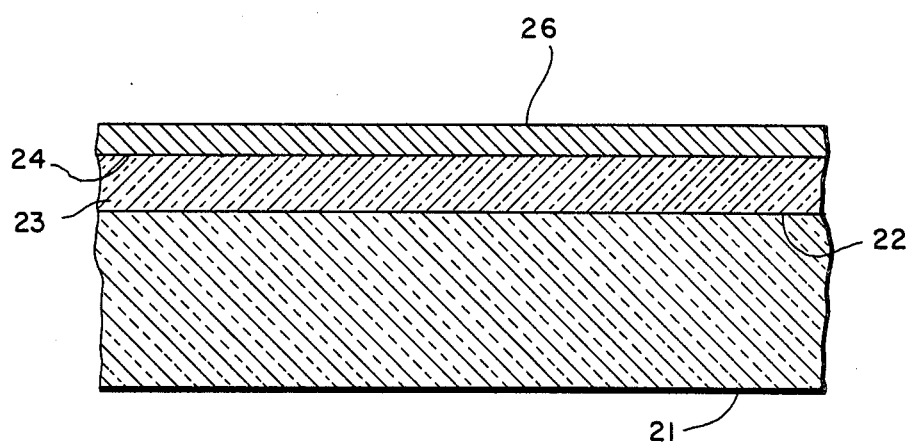

CURED EPOXY POLYMER HAVING IMPROVED ADHESIVE PROPERTIES

REFERENCE TO RELATED APPLICATION

This is a division of application Ser. No. 465,376, filed May 1, 1974 which is a C.I.P. of application Ser. No. 443,648, filed Feb. 19, 1974, now abandoned, which is a C.I.P. of application Ser. No. 369,038, filed June 11, 1973, now abandoned. Said copending application is assigned to the same assignee as the instant application.

BACKGROUND OF THE INVENTION

1. Field of the Invention

This invention relates to a cured epoxy polymer having improved adhesive properties to a metal deposited on a surface thereof, and more particularly, to a cured epoxy polymer resulting from curing a mixture comprising (a) a diglycidyl ether based upon linoleic dimer acid, (b) an elastomerically modified epoxy resin blend, (c) a diglycidyl ether of bisphenol A (4,4'-isopropylidene diphenol) and/or bisphenol F (methylenediphenol) and (d) a suitable curing agent.

2. Description of the Prior Art

During the past few years, a market for metal-plated polymer parts has grown rapidly as manufacturers have begun to appreciable the functional appearance of such parts when plated with bright, metallic finishes, and to take advantage of economies in cost and weight afforded by substituting molded polymeric parts for metal. Furthermore, such plated finishes are not as susceptible to pitting and corrosion because there is not a galvanic reaction between a polymeric substrate and a plated metal.

Because polymeric materials normally do not conduct electricity, it is common practice to provide a conductive layer or coating, such as copper, by electroless deposition so that an additional thickness of metals, particularly copper, nickel and chromium, can be electrolytically plated onto the electroless copper layer. Electroless deposition refers to an electrochemical deposition of a metal coating on a conductive, nonconductive, or semiconductive substrate in the absence of an external electrical source. While there are several methods of applying this metallic coating by a combined use of electroless and electrolytic procedures, it was not until quite recently that processes were developed which can provide even minimal adhesion of the conductive coating to the polymer. This is because overall adhesion is governed by the bond strength between the polymer substrate and the electroless copper layer. Even with these improved processes, reasonable adhesion can be obtained with only a very few polymers, and then only when great care is taken in all of the steps for the preparation and plating of the polymer substrate.

Polymers extensively employed and upon which electroless deposition is conducted, especially in the printed circuit industry are epoxy polymers resulting from curing uncured diglycidyl ethers of bisphenol A resins produced by a condensation reaction between bisphenol A and epichlorohydrin. The condensation reaction products or epoxy resins have a general structure

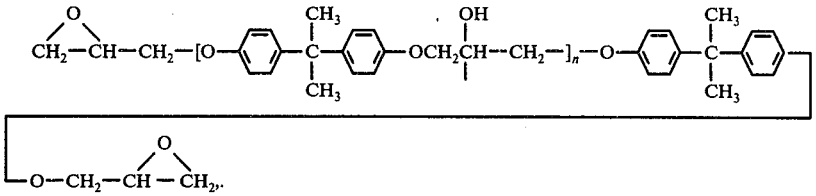

where $n$ is the number of repeated units in the resin chain. The varying types of these epoxy resins are described in terms of their viscosity or softening point, epoxide equivalent weight and hydroxyl content. The epoxide equivalent weight is defined as the number of grams of resin containing one gram equivalent of epoxide. The epoxide equivalent weight is determinative of the number of repeated units in the epoxy resin chain. The hydroxyl content is defined as the number of equivalents of hydroxyl groups contained in 100 grams of resin.

One of the valuable properties of epoxy resins, i.e., diglycidyl ethers of bisphenol A and variants or modifications thereof, is their ability to transform readily from a liquid or viscous state to tough, hard thermoset solids, i.e., transform from a linear structure to a network crosslinked in three dimensions. This hardening is accomplished by the addition of a chemically active reagent known as a curing agent. Some curing agents promote curing by catalytic action, others participate directly in the curing reaction and are absorbed into the resin chain.

The surface of a cured or crosslinked epoxy article is hydrophobic and is therefore not wet by liquids having a high surface tension. Since electroless depositions usually employ aqueous sensitizing and activating solutions having metal ions therein, the surface will not be wet thereby. Since the sensitizing and activating solutions will not wet the surface, the catalytic species are not absorbed onto the surface and subsequent deposition of the metal ions cannot proceed.

In the present state of the art, various methods are available for rendering the surface of a polymer or a plastic material hydrophilic. One method in common practice in plating plastic materials entails mechanical roughening of the surface of the plastic. Initially, this surface roughening is accomplished by some form of mechanical deglazing, such as scrubbing with an abrasive slurry, wet tumbling, dry rolling or abrasive (sand) blasting. However, this prior art method gives an adhesion of up to 3 lbs./in. at 25° C for a copper pattern on a cured polymer based upon the diglycidyl ether of bisphenol A. This adhesion is unsatisfactory for printed circuit boards having a copper pattern thereon. It has been empirically established that a minimum peel strength of about 5 lbs./in., at a 90° peel and a peel rate of 2 in./min. at 25° C is required to prevent a metal coating from blistering or peeling from a plastic surface during variations in temperature and to allow for various processing steps usually employed in generating the copper pattern. The adhesion requirements for printed circuit boards is therefore at least 5 lbs./in. at a 90° peel and a peel rate of 2 in./min. at 25° C (for a copper thickness of 1.4 mil).

In addition, this mechanical deglazing process is costly in that many parts have to be finished by hand and, in the case of relatively small parts, or parts with complex contours, it is very difficult to abrade the surface uniformly by conventionl means. Of greatest disadvantage, however, is in forming printed circuits, utilizing a photoimaging process, such as the photoselective metal deposition process revealed in U.S. Pat. No. 3,562,005, assigned to the assignee hereon. The photoimaging process inherently requires a high pattern resolution. This resolution is limited by the topography of the surface on which the pattern is generated. When mechanical deglazing is employed, e.g., by sand blasting, the resolution of the pattern suffers because of the mechanically roughened surface.

In more recent years, chemical deglazing or etching techniques were developed for various plastics using strong acidic solutions. U.S. Pat. No. 3,437.597 reveals a chromic acid treatment of plastics, such as an acrylonitrile-butadiene-styrene (A-B-S) and an amine cured diglycidyl ether of bisphenol A epoxy, to improve the adherence of an electroless deposit to the surface thereof. Again, as indicated above, a minimum adhesion value of 5 lbs./in. has to be met for printed circuit boards. A cured diglycidyl ether of bisphenol A epoxy polymer treated with chromic acid gives adhesion values of about 3 lbs./in. for metallic patterns deposited thereon.

Another method, generally employed for plastics, such as A-B-S, comprises treating the plastic with an organic solvent thereof. U.S. Pat. No. 3,425,946 reveals such a method with A-B-S plastic. However, what solvents are effective depend on the plastic employed and is therefore empirical in nature. Organic solvent pretreatment alone is ineffective in raising the adherence of metallic patterns to cured epoxies such as the epoxy polymers resulting from curing the diglycidyl ether of bisphenol A. A cured diglycidyl ether of bisphenol A epoxy treated in this fashion exhibits an adhesion of about 3 lbs./in., whereas as stated above, 5 lbs./in. is the minimum amount desired for printed circuit board (at 25° C).

There has not heretofore been electroless metallization of a virgin epoxy, i.e., an as-cured epoxy without pretreatment of any surface thereof with solvents, etchants, abrasives, etc., to render such surface hydrophilic.

A cured epoxy surface which gives improved adherence with respect to an electroless metal deposited thereon, without pretreatment thereof (etching, solvation, abrading, etc.), is therefore needed and is an object of this invention.

SUMMARY OF THE INVENTION

This invention relates to a cured epoxy polymer having improved adhesive properties to a metal deposited on a surface thereof and more particularly, to a cured epoxy polymer resulting from curing a mixture comprising (a) a diglycidyl ether based upon linoleic dimer acid, (b) an elastomerically modified epoxy resin blend, (c) a diglycidyl ether of bisphenol A (4,4'-isopropylidenediphenol) and/or bisphenol F (methylenediphenol) and (d) a suitable curing agent.

The cured epoxy polymer comprises the reaction product of a mixture comprising a resin component and a suitable curing agent component. The resin component comprises (1) $x$ parts by weight, per 100 parts by weight of the resin component, of a diglycidyl ether based upon linoleic dimer acid having a structural formula of

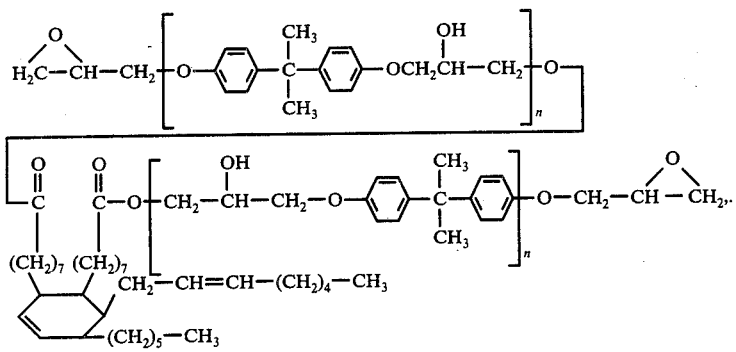

where $n = 0$, 1 and having an epoxide equivalent weight of 400 to 420 when $n = 0$ and an epoxide equivalent weight of 650 to 750, when $n = 1$; (2) $y$ parts by weight, per 100 parts by weight of the resin component, of an elastomerically modified epoxy resin blend comprising the reaction product of (a) about 40 weight percent of a carboxyl terminated acrylonitrile/butadiene random copolymer having a structural formula of

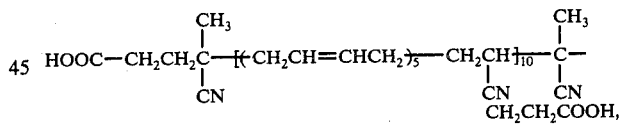

containing 2.37 percent carboxyl groups, having a number average molecular weight of 3200, containing 18 to 19 percent bound acrylonitrile, and having a viscosity of 110,000 cps at 27° C; combined with (b) about 60 weight percent of a diglycidyl ether selected from the group comprising bisphenol A having an epoxide equivalent of 180 to 195 and bisphenol F having an epoxide equivalent weight of 152 to 167; and (3) $z$ parts by weight, per 100 parts by weight of the resin component, of a suitable diglycidyl ether selected from a diglycidyl ether of bisphenol A (brominated or unbrominated), a diglycidyl ether of bisphenol F, or a mixture thereof, where $x + y + z = 100$, and $z$ is less than 100.

A preferred resin component comprises about 25 to about 95 parts by weight, per 100 parts by weight of the resin component, of the diglycidyl ether based upon linoleic dimer acid (= 25 to 95); about 5 to about 50 parts by weight, per 100 parts by weight of the resin component, of the elastomerically modified epoxy resin blend (y = 5 to 50); and a remainder of the suitable diglycidyl ether (z = 0 to 70).

The suitable curing agent comprises one selected from (a) a suitable acid anhydride present in an amount ranging from about 16 to about 60 parts by weight per 100 parts by weight of the resin component, (b) a suitable polyamine present in an equal mole-to-mole ratio with the resin component, (c) a mixture comprising the polyamine in (b) above combined with at least 5 parts by weight per 100 parts by weight of the resin component of a suitable acid anhydride, (d) a mixture comprising the anhydride in (a) above combined with up to about 30 parts by weight per 100 parts by weight of the resin component of a carboxylic acid selected from the group comprising a dicarboxylic acid having a structural formula of $(HOOC-)_2R''$ where $R''$ is an organic radical selected from troless plating bath, upon a cured epoxy having improved adhesive properties. However, it will be understood that such description is exemplary only and is for purposes of exposition and not for purposes of limitation. It will be readily appreciated that the inventive concept described is equally applicable to applying to the cured epoxy other conventional species which may be utilized in cementing, printed and metallizing the epoxy. Again, it is, of course, to be understood that by a "cured epoxy" is meant the product resulting from curing a curable mixture comprising a resin component of (a) a diglycidyl ether based upon linoleic dimer acid, (b) an elastomerically modified epoxy resin blend and (c) a diglycidyl ether of bisphenol A and/or bisphenol F, cured with a suitable curing agent component selected from an acid anhydride, a polyamine, a mixture of an acid anhydride and a polyamine, and a mixture of

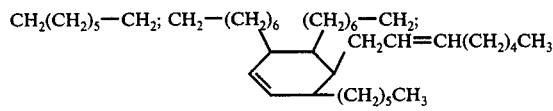

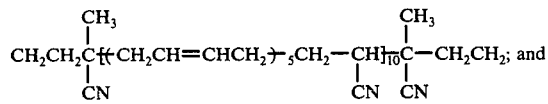

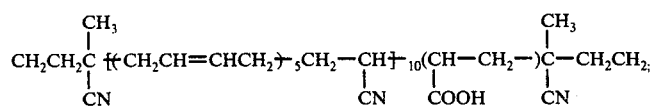

a trimer acid having a stoichiometry of $C_{54}H_{96}O_6$, an acid value of 145 to 185 (milligrams of KOH neutralized per gram of trimer acid) and an average number molecular weight of about 810, and (e) mixtures thereof.

an acid anhydride and a suitable carboxylic acid.

A suitable diglycidyl ether based upon linoleic dimer acid is the adduct of two moles of the diglycidyl ether of bisphenol A and one mole of linoleic dimer acid (ratio of 2:1) having the structural formula

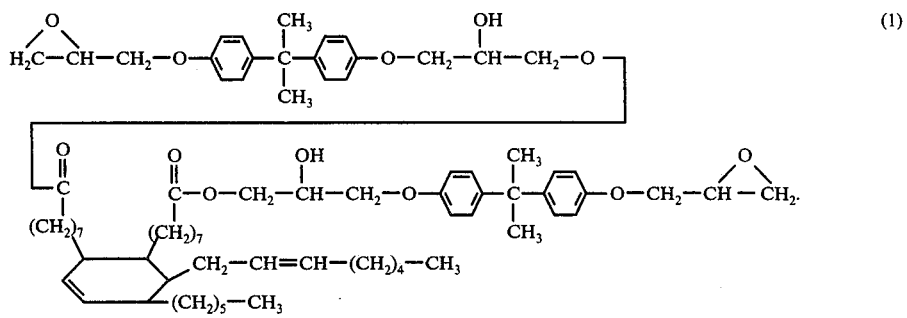

(1)

DESCRIPTION OF THE DRAWING

The present invention will be more readily understood by reference to the drawing taken in conjunction with the detailed description, wherein the FIGURE is a cross-sectional view of a laminar body of the invention comprising a cured epoxy-coated substrate plated with an electroless metal deposit.

DETAILED DESCRIPTION

The present invention is described primarily in terms of an adherent copper deposit, deposited from an elec- These uncured modified diglycidyl ethers are described in terms of their epoxide equivalent weight. The expoxide equivalent weight is defined as the number of grams of resin containing one gram equivalent of epoxide. The above-described linoleic dimer ester modified diglycidyl ether of bisphenol A employed has an epoxide equivalent weight of 650 to 750.

A second suitable diglycidyl ether of linoleic dimer acid is one having a general structural formula

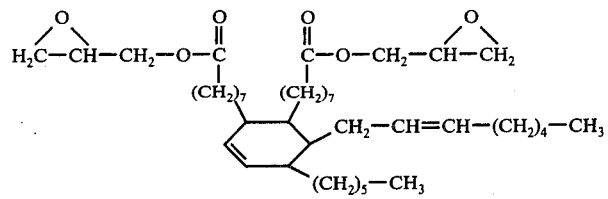

and an epoxide equivalent weight of 400 to 420.

The concentration of the above-described suitable diglycidyl ether based upon linoleic dimer acid resins in the resin component ranges from a minimum of about 0 parts by weight 100 parts by weight of the total resin component (to be cured) to a maximum representing the entire resin component, i.e., 100 parts by weight per 100 parts by weight of the resin. A preferred concentration ranges from about 25 to about 95 parts by weight per 100 parts by weight of the total resin component.

Combined with the diglycidyl ether based upon linoleic dimer acid, when of course the resin component to be cured comprises less than 100 parts by weight of the diglycidyl ether based upon linoleic dimer acid, is a suitable elastomerically modified epoxy resin blend. A suitable elastomerically modified epoxy resin blend comprises the reaction product of about 40 weight percent of a carboxyl terminated acrylonitrile/butadiene random copolymer having a structural formula of

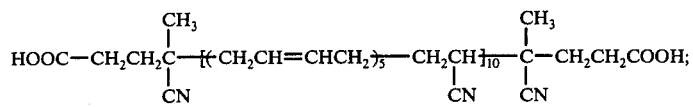

containing 2.37 percent carboxyl groups, 18 to 19 percent bound acrylonitrile, having a number average molecular weight of 3200 and a viscosity of 110,000 cps at 27° C combined with about 60 weight percent of a diglycidyl ether selected from (1) bisphenol A, having a structural formula

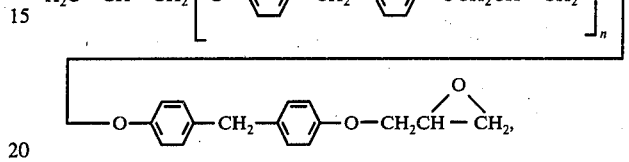

where $n$ is the number of repeated units in the resin chain, and having an epoxide equivalent weight of 180 to 195 and (2) bisphenol, P, having a structural formula of

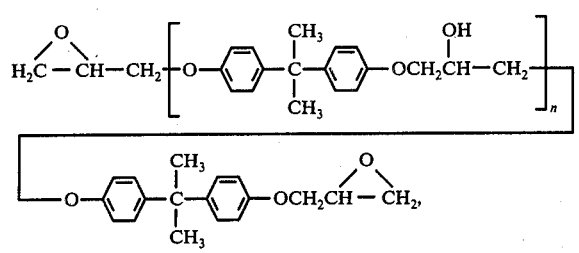

where $n$ is the number of repeated units in the resin chain, and having an expoxide equivalent weight of 152 to 167.

The diglycidyl ether (60 weight percent) of bisphenol A or bisphenol F is typically reacted with the carboxyl terminated acrylonitrile/butadiene random copolymer (40 weight percent) at 300° F for 30 minutes to yield a desired reaction product of elastomerically modified epoxy resin blend. The desired reaction product or elastomerically modified epoxy resin blend comprises a mixture of the diglycidyl ether of bisphenol A or bisphenol F and the adduct of two moles of the diglycidyl ether of bisphenol A or bisphenol F and one mole of the carboxyl terminated acrylonitrile/butadiene copolymer which is believed to have the following structural formula

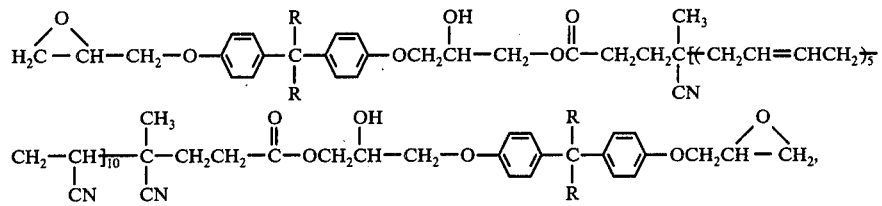

where R is a radical selected from H and $CH_3$.

When the diglycidyl ether of bisphenol A is employed as the reactant, the resultant desired reaction blend or mixture has an epoxide equivalent weight of 335 to 355, a viscosity of Y-Z (Gardner-Holdt, 80% N.V. in methyl cellosolve [methoxy ethanol]), and an acid value of less than 0.2 (number of milligrams of KOH neutralized per one gram of the reaction resin blend). When the diglycidyl ether of bisphenol F is employed as the reactant, the resultant desired reaction blend or mixture has an epoxide equivalent weight of 285 to 305, a viscosity of X-Y (Gardner-Holdt, 80% N.V. in methyl cellosolve), and an acid value of less than 0.2 (milligrams of KOH neutralized per one gram of the reaction resin blend).

The concentration of the above-described elastomerically modified epoxy resin blend ranges from a maximum of about 50 parts by weight per 100 parts by weight of the resin component down to zero (where for example the resin component comprises essentially all of the diglycidyl ether based upon linoleic dimer acid). A preferred concentration range however ranges rom about 5 to about 50 parts by weight per 100 parts by weight of the resin component.

The resin component may also comprise a remainder of a suitable diglycidyl ether selected from a diglycidyl ether of bisphenol A, a diglycidyl ether of bisphenol F or a mixture of the two. Again, it is, of course, understood that such a remainder is dependent upon the amounts of the other epoxy-group containing materials of the resin component. The diglycidyl ethers of bisphenol A are described in terms of their viscosity or softening point, epoxide equivalent weight and hydroxyl content. Again, the epoxide equivalent weight is defined as the number of grams of resin containing one gram equivalent of epoxide. The hydroxyl content is defined as the number of equivalents of hydroxyl groups contained in 100 grams of resin.

Some typical suitable diglycidyl ethers of bisphenol A resins are those having an epoxide equivalent weight of 170 to about 4000. Some typical examples of these epoxy resins are (1) DEP ® 331 which is a trademark product of Dow Chemical Company and which is an epoxy resin having an epoxide equivalent weight of 182 to 190 and a viscosity of 10,000 to 16,000 cps; (2) Epon ® 836 which is a trademark product of Shell Chemical Company and which is an epoxy resin having an epoxide equivalent weight of 280 to 350, a softening point of 40° to 45° C and a hydroxyl content of 0.21; (3) Epon ® 1001 which is a trademark product of Shell Chemical Company and which is an epoxy resin having an epoxide equivalent weight of 450 to 550, a softening point of 65 to 74° C and an hydroxyl content of 0.28; (4) Araldite ® 6097 which is a trademark product of Ciba-Geigy Corporation and which is an epoxy resin having an epoxide equivalent weight of 2,000 to 2,500 and a softening point of 125° to 135° C; (5) Epon ® 1009 which is a trademark product of Shell Chemical Company and which is an epoxy resin having an epoxide equivalent weight of 2,500 to 4,000 and a softening point of 145° to 155° C.

Some typical suitable epoxy resins incorporating tetrabromobisphenol A (3,3',5,5'-tetrabromo-4,4'-isopropylidenediphenol) to impart fire retardancy to the cured composite are the diglycidyl ethers of tetrabromobisphenol A having a structural formula

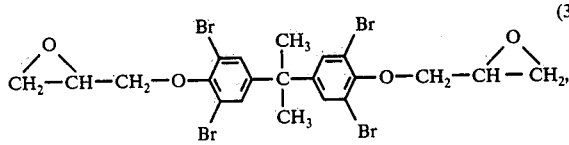
(3)

and epoxy resins containing both bisphenol A and tetrabromobisphenol A having a structural formula

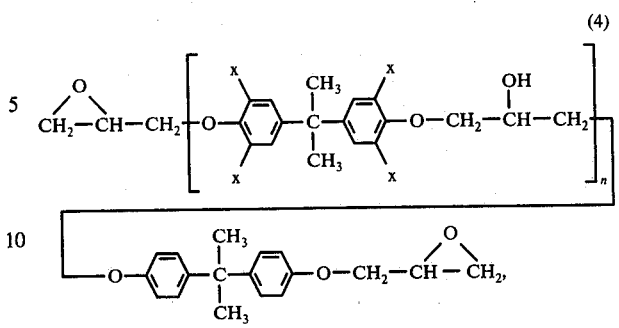
(4)

where $n$ is the number of repeated units in the resin chain and X is either bromine or hydrogen depending upon the method of manufacture of the epoxy resin. Some typical suitable diglycidyl ethers of tetrabromobisphenol A resins are (1) DER ® 542 which is a trademark product of Dow Chemical Company and which is an epoxy resin having an epoxide equivalent weight of 325 to 375, a softening point of 45 to 55° C and a bromine content of 44-48% by weight and (2) Epi-Rez ® 5163 which is a trademark product of Celanese Corporation and which is an epoxy resin having an epoxide equivalent weight of 350 to 450 and a bromine content of 50% by weight. Typical examples of suitable epoxy resins containing both bisphenol A and tetrabromobisphenol A are (1) Epon ® 1045 which is a trademark product of Shell Chemical Company and which is an epoxy resin having an epoxide equivalent weight of 450 to 500 and a bromine content of 19% by weight and (2) Araldite ® 8011 which is a trademark product of Ciba-Geigy Corporation and which is an epoxy resin having an epoxide equivalent weight of 455 to 500 and a bromine content of 19-23% by weight.

The diglycidyl ethers of bisphenol F are described in terms of their epoxide equivalent weight. Some typical suitable diglycidyl ethers of bisphenol F resins are those having an epoxide equivalent weight of 165 to 180.

The resin component is then combined with a curing agent component to form the curable mixture (reaction mixture). A curing agent is one selected from (a) a suitable acid anhydride, (b) a suitable polyamine, (c) a mixture of the acid anhydride and the polyamine, (d) a mixture of the acid anhydride and a suitable carboxylic acid and (e) mixtures of the foregoing.

Typical suitable anhydrides are chlorendic anhydride, the maleic anhydride adduct of methylcyclopentadiene [a light yellow semiviscous liquid with a viscosity of 138.4 cps. at 25° C (available commercially as "Madic Methyl Anhydride")] having a structural formula

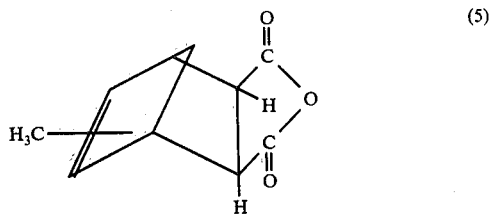
(5)

phthalic anhydride, citraconic anhydride, glutaric anhydride, maleic anhydride, and mixtures thereof. Other typical anhydrides which may be employed are described in U.S. Pat. No. 3,329,652.

The total concentration of the uncombined acid anhydride curing agent ranges from a minimum of about 16 parts by weight of about 60 parts by weight per 100 parts by weight of the resin component. An anhydride to epoxide molar ratio of 0.6 to 0.9 yields the optimum adhesive properties of the cured polymer.

Typical suitable polyamines include dicyandiamide, metaphenylenediamine, hexamethylenediamine, triethylenetetraamine, polyoxypropylenediamine having a structural formula of

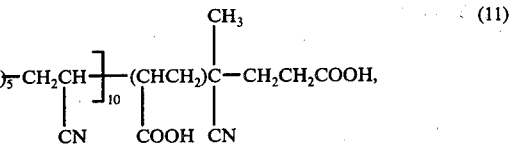

where $n$ is about 2), and polyoxypropylenetriamine having a structural formula of

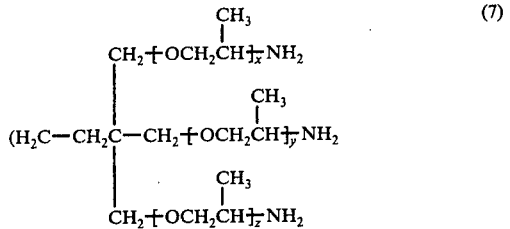

where $x + y + z = 5.3$).

The polyamine curing agent is typically combined to give equimolar concentrations of amine hydrogen and epoxide. It has been found that a mixture of the polyamine and a suitable acid anhydride such as glutaric, maleic anhydride, citraconic anhydride, etc., can also be employed where the acid anhydride is present in the mixture in an amount ranging up to about 10 parts by weight per 100 parts by weight of the resin component.

Typical suitable carboxylic acids which may be combined with the acid anhydride curing agent are linoleic dimer acid having a structural formula of

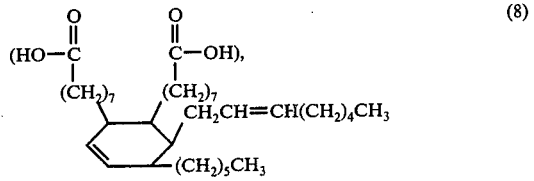

linoleic trimer acid having a stoichiometry of $C_{54}H_{96}O_6$, an acid value of 145 to 185 and an average molecular weight of about 810, azaleic acid having a structural formula of

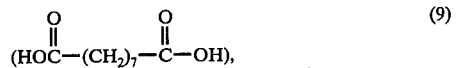

and a carboxyl terminated acrylonitrile/butadiene random copolymer selected from one having a structural formula of

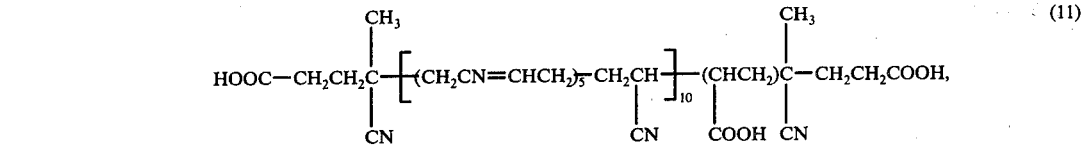

containing 2.37 percent carboxyl groups, 18 to 19 percent bound acrylonitrile, having a number average molecular weight of about 3200 and a viscosity of 110,000 cps at 27° C; and one having a structural formula of

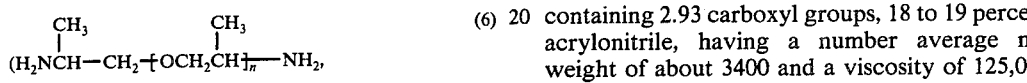

containing 2.93 carboxyl groups, 18 to 19 percent bound acrylonitrile, having a number average molecular weight of about 3400 and a viscosity of 125,000 cps at 27° C. The carboxylic acid concentration present in an acid anhydride-carboxylic acid curing agent mixture ranges up to about 20 parts by weight per 100 parts by weight of the resin component combined with about 20 to about 60 parts by weight per 100 parts by weight of the resin component of the acid anhydride.

It is, of course, to be understood that the selected curing agent can be combined with other type curing agents or accelerators therefor, e.g., an amine such as benzyldimethylamine. It is also to be understood that conventional filler materials, such as aluminum oxide, silicon dioxide, titanium dioxide and flame retardant additives such as antimony trioxide may also be added to the resultant resin-curing agent reaction mixture.

The mixture of epoxy resin and curing agent may then be heated to attain homogenization, complete liquifaction and initiate a partial cure, e.g., typically at 50°–100° C for 5 to 60 minutes. It is to be noted that, when physically expedient to do so, the mixture may be used without a pre-cure heat treatment. Also, alternatively, the reaction mixture may be dissolved in a suitable solvent, e.g., acetone.

Referring to the FIGURE, a suitable substrate or base 21 is selected. A suitable substrate or base 21 may comprise any material which is compatible with the epoxy resin with which it is destined to be coated and which resin is destined to be cured. For printed circuit manufacture, the substrate 21 may be of a rigid material, e.g., glass, metal, etc., or of a flexible material, e.g., a polymer or plastic, e.g., a polyester. Applied to a surface 22 of the substrate 21 is the curable mixture comprising the resin component, the curing agent component and any solvents, fillers or additives. The mixture may be applied to the surface 22 by any conventional means, e.g., spraying, dipping, spinning, etc., whereby a coat or layer 23 thereof forms. The layer 23 may be of any desired thickness, typically it may range from 0.5 to 20 mils thick.

The coated substrate 21 is then heated under conditions of time and temperature, e.g., typically ranging from 5 to 60 minutes at 140°–170° C, whereby a fully cured epoxy polymer results. By a full cure one means that the epoxy groups originally present have been consumed during the curing reaction and the degree of cross-linking provides optimum physical properties for the desired application. For the desired time and temperature relations ascribed to above infrared spectroscopy shows that the anhydride and epoxy groups have been consumed. In addition, the epoxy polymer no longer flows when submitted to a heat and pressure cycle.

It is, of course, to be understood that the time and temperature curing parameters are interdependent and that variations in the temperature will require variations in the time whereby optimum results will be attained. In this regard, the various curing parameters and their interdependency are well known in the art, and their interaction between one another is also well known or can be easily ascertained experimentally by one skilled in the art in the light of the subject invention disclosed herein.

A suitable species is then deposited on a surface 24 of the cured epoxy layer or coat 23. A suitable species may be any of a multitude of materials well known in the art which can be deposited upon a cured epoxy surface and comprises in part conventional aqueous or organic based paints, lacquers, inks and adhesives, aqueous or non-aqueous solutions of inorganic salts, aqueous or non-aqueous electroless metal deposition solutions and the metal deposits resulting therefrom, metals, etc. The suitable species may be deposited or applied to the cured epoxy surface 24 by any standard means known in the art including dipping, brushing, spray coating, spin coating, vapor depositing, electroless depositing with or without electrodepositing, sputtering, etc.

It is to be noted and stressed at this point that unlike prior epoxy formulations and methods of metallization thereof, the virgin epoxy disclosed in this invention, i.e., the cured epoxy which results (which includes aged material and/or reconstituted from scrap material), does not have to be pretreated (etched, solvated, sand blasted, etc.) to be rendered hydrophilic to achieve adherent electroless metallization (as well as adherent electrodeposited metallization) to a surface thereof. This is a surprising and unexpected property of the epoxy disclosed herein and the method employed in its metallization.

The selected species-deposited, cured epoxy surface 24 is then thermally aged or post baked for a period of time sufficient to insure adequate adhesion of the selected species to the cured epoxy surface, e.g., an adequate adhesion typically being represented by a metal deposit (electroless and electro) evidencing a peel strength of at least 5 lbs./in. at 25° C. The thermal aging typically may be as low as a temperature of 120° C for 10 minutes or as high as 180° C for one hour. Again, it is to be understood and stressed that the above temperature and time parameters are all interdependent and that variations in temperature will produce variations in the other parameters whereby optimum results will be attained. In this regard, the time-temperature adhesion parameters can be easily ascertained experimentally by one skilled in the art in view of the subject invention disclosed herein.

Where the selected species is an electrolessly deposited metal, a standard electroless technique may be employed. Again, it is to be pointed out that the cured epoxy surface 24 is a virgin surface in that it has not been etched, roughened, solvated, swell-etched, etc., to render the surface more receptive to electroless plating sensitizing, activating and plating solutions, such an expedient being unnecessary. A typical electroless technique which is illustrative only and not restrictive is as follows. The cured epoxy surface 24 is thoroughly rinsed with water or any other suitable cleaning agent. Proper rinsing is essential in order to remove essentially all contamination, such as contaminating particles, etc., so as not to contaminate a sensitizing, an activating and an electroless plating solution to which the epoxy surface 24 is destined to be subjected. Contamination, particularly of the plating bath, is undesirable because the stability of such plating baths is frequently adversely affected by such a condition.

After rinsing, the cured epoxy surface 24 is then sensitized. Sensitization consists of depositing or absorbing on the epoxy surface 24 a sensitizing species, e.g., $Sn^{+2}$ ions, which is readily oxidized. Conventionally, the cleaned surface 24 is dipped into a standard sensitizing solution, e.g., aqueous stannous chloride with a supporting medium such as HCl, ethanol, ethanol and caustic, or ethanol and hydroquinone. It is to be understood that the sensitizing solutions and the conditions and procedures of sensitizing are well known in the art and will not be elaborated herein. Such sensitizers and procedures may be found, in part, in *Metallic Coating of Plastics*," William Goldie, Electrochemical Publications, 1968.

After sensitizing, the sensitized epoxy surface 24 is rinsed, then activated. It is to be noted that it is important that the sensitized surface 24 be rinsed thoroughly in a cleaning medium, e.g., deionized water, after sensitizing. If such is not done, there is a possibility that excess sensitizer on the surface will cause reduction of an activating species, e.g., $Pd^{+2}$, to which the sensitized surface is destined to be exposed, in non-adherent form on the surface 24. Activation relates to providing a deposit of a catalytic metal, e.g., Pd, over the surface of the cured epoxy polymer, in sufficient quantities to successfully catalyze a plating reaction once the surface 24 is introduced into an electroless plating bath. The sensitized surface 24 is exposed to a solution containing the activating species, e.g., a noble metal ion, wherein the sensitizing species is readily oxidized and the noble metal ion, e.g., $Pd^{+2}$, is reduced to the metal, e.g., Pd, which in turn is deposited on the cured epoxy surface 24. The deposited activating metal, e.g., Pd, acts as a catalyst for localized further plating. Again, it is to be understood that the various activating metal ions and their solutions, the conditions and procedures of activation are well known in the art and will not be elaborated herein. Such activators and procedures may be found, in part, in *Metallic Coating of Plastics*, previously referred to.

After the activating step, the activated epoxy surface 24 is rinsed with deionized water and then immersed in a standard electroless plating bath containing a metal ion, e.g., $Cu^{+2}$, destined to be reduced by the catalytic metal species, e.g., Pd. The metal ion, e.g., $Cu^{+2}$, is reduced by the catalytic metal, e.g., Pd, and is electrolessly deposited on the polymeric surface 24 to form a metallic, e.g., Cu, layer or deposit 26 (referring to the FIGURE). Again, it is to be pointed out that the electroless baths, the electroless plating conditions and procedures are well known in the art and will not be elaborated herein. Reference is again made to *Metallic Coating of Plastics*, previously referred to, for some typical examples of electroless baths and plating parameters. It is to be noted that in some cases, it is possible to combine the sensitizing and activating steps into one step. The electroless metal-deposited, cured epoxy composite is then thermally aged, e.g., at 110° to 180° C for 10 to 60 minutes whereby an adherent electroless metal deposit is attained. It is to be noted that the electroless metal deposit may be subjected to a conventional electroplating treatment whereby it is built up. In such a situation, it is, of course, understood that there may be an additional thermal aging or post bake or just one thermal aging, after the final electroplating treatment.

A preferred method of electrolessly depositing a metal on the resultant cured epoxy surface is the method revealed in U.S. Pat. No. 3,562,005, assigned to the assignee hereof and incorporated by reference hereinto. The preferred method entails applying a photopromoter solution to the surface 24 utilizing procedures revealed in U.S. Pat. No. 3,562,005. A photopromoter is defined as a substance which, upon being exposed to appropriate radiation, either (a) dissipates chemical energy already possessed thereby or (b) stores chemical energy not previously possessed thereby. When the substance possesses or has stored chemical energy it is capable of promoting, other than as a catalyst, a chemical reaction whereby it, the photopromoter, undergoes a chemical change in performing its function (unlike a catalyst). The resultant photopromoter-covered, cured epoxy surface 24 may then be rinsed with deionized water (depending on the type of photopromoter employed) and is then dried. The photopromoter-coated surface 24 is then selectively exposed to a source of ultraviolet radiation, through a suitable mask, to form at least one region which is capable of reducing a precious metal from a precious metal salt, e.g., $PdCl_2$. The region so capable is exposed to the precious metal salt, e.g., $PdCl_2$, whereby the precious metal salt is reduced to the precious metal, e.g., Pd, which in turn is deposited thereon.

The precious metal-deposited region is then exposed to a suitable electroless metal plating bath, e.g., copper, wherein the metal, e.g., copper, is plated on the region forming an adherent metal deposit or layer 26 on the cured epoxy surface 24. The electroless metal-deposited cured epoxy surface 24 is then thermally aged or post baked, e.g., typically at 110° to 180° C for 10 to 60 minutes, whereby an adherent electroless metal deposit 26 is attained. It is to be noted that the electroless metal deposit may be subjected to a conventional electroplating treatment whereby the electroless metal deposit is built up. In such a situation, it is again to be understood that there may be an additional thermal aging or just one thermal aging, after the electroplating treatment.

A suitable photopromoter solution may be either a positive type or a negative type as discussed in U.S. Pat. No. 3,562,005. A suitable mask, either positive or negative, depending on whether the photopromoter is positive or negative, is one as discussed in U.S. Pat. No. 3,562,005, and typically comprises a quartz body having a radiation opaque pattern thereon. The ultraviolet radiation source is a source of short wavelength radiation (less than 3,000A, and typically about 1,800A to about 2,900A).

EXAMPLE I

An epoxy resin-curing agent mixture (liquid) was prepared in the following manner. One hundred fifty grams (75 parts by weight per 100 parts by weight of the resin component of the mixture) of a commercially obtained epoxy resin, the adduct of two moles of the diglycidyl ether of bisphenol A (epoxide equivalent weight of 180 to 195) and one mole of linoleic dimer acid having the structural formula

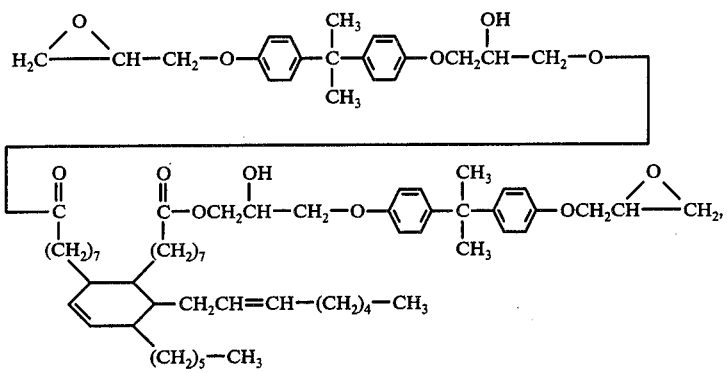

and an epoxide equivalent weight of 650 to 750 was combined with 50 grams (25 parts by weight per 100 parts by weight of the resin component) of a commercially obtained, custom-synthesized elastomerically modified epoxy resin blend comprising the reaction product of a mixture comprising (1) 40 weight percent of a carboxyl terminated acrylonitrile/butadiene random copolymer having a structural formula of

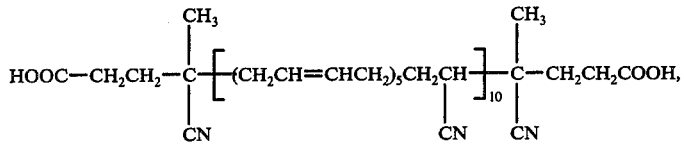

containing 2.37 percent carboxyl groups, 18 to 19 percent bound acrylontrile, having a number average molecular weight of 3200 and a viscosity of 110,000 cps at 27° C and (2) 60 weight percent of a diglycidyl ether comprising bisphenol A having an epoxide equivalent weight of 180 to 195. The mixture had been heated at 300° F for 30 minutes to yield a reaction product or blend having an epoxide equivalent weight of 335 to 355, an acid value or number of less than 0.2 milligram of KOH/gram of reaction product, and a viscosity of Y-Z (Gardner-Holdt 80% N.V. in methyl cellosolve [methoxy ethanol]).

To the resin component was added 40 grams of chlorendic anhydride (20 parts by weight per 100 parts by weight of the resin component) and 5 grams of phthalic anhydride (two and one-half parts by weight per 100 parts by weight of the resin component) to form the 18–20% by weight of bromine and having the structural formula previously described and designated as structural formula (4), above,

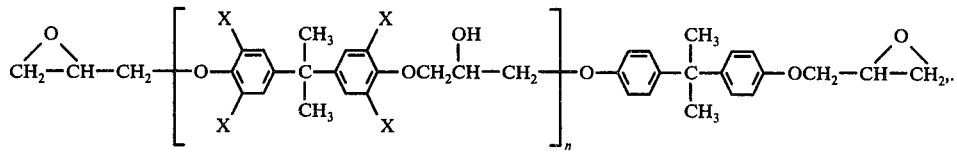

epoxy resin-curing agent mixture. The resultant mixture was then heated to liquifaction at 60° C for 30 minutes.

Refering to the FIGURE, a commercially obtained epoxy-glass laminate was employed as a substrate 21. The liquified epoxy resin-curing agent mixture was applied to a surface 22 thereof, using a conventional means, to form an epoxy (partially cured) layer 23 thereon (0.5 to 2 mils thick). The coated substrate 21 was then heated at 150° C for 30 minutes to obtain a fully cured epoxy layer or coat 23 as evidenced by infrared spectroscopy which revealed a disappearance of anhydride and epoxide functional groups.

The fully cured epoxy-coated substrate 21 (virgin epoxy coated) was then sensitized by immersion in a conventional aqueous hydrous oxide tin sensitizer (a 3.5 weight percent $SnCl_2.2H_2O$ and 1 weight percent $SnCl_4.5H_2O$ aqueous solution) for one minute at 25° C, activated in a .05 weight percent aqueous $PdCl_2$ solution by immersion therein for 30 seconds, water rinsed for two minutes and then immersed in a commercially obtained electroless copper plating bath to deposit an electroless copper layer 26 on the epoxy layer 23. The electroless copper layer 26 was then subjected to a conventional electroplating to obtain a 1.5 mil thick copper layer 26 and thereby form a laminar article comprising a metal (Cu) layer 26 deposited on an epoxy layer 23. The electroplated deposited substrate 21 was then heated or baked at 120° C for 10 minutes.

A peel strength measurement of the deposited metal was undertaken at a 90° peel at a rate of two inches per minute employing a conventional peel testing apparatus. The peel strength was 14.3 lbs./linear inch at 25° C. At 90° C the peel strength value was 1.1 lb./linear inch. For printed circuit manufacture a peel strength of 5 lbs./linear inch at 25° C is adequate.

EXAMPLE II

The procedure of Example I was repeated except that the resin component of the mixture comprised the following:

(a) 30 grams (30 parts by weight/100 parts by weight of the resin component) of the adduct of two moles of the diglycidyl ether of bisphenol A having an epoxide equivalent weight of 180 to 195 and one mole of linoleic dimer acid (of Example I);

(b) 30 grams (30 parts by weight/100 parts by weight of the resin component) of the reaction product or elastomerically modified epoxy resin blend resulting from combining 40% by weight carboxyl terminated butadiene/acrylonitrile random copolymer and 60% by weight of the diglycidyl ether of bisphenol A having an epoxide equivalent weight of 180 to 195; [of Example I]; and (c) 40 grams (40 parts by weight/100 parts by weight of the resin component) of a brominated diglycidyl ether of bisphenol A, commercially obtained, having an epoxide equivalent weight of 450 to 500 and containing where $n$ = number of repeated units and $x$ = H or Br.

The resin component was combined with a curing agent component comprising 30 grams (30 parts by weight/100 parts by weight of the resin component) of chloroendic anhydride and 16 grams (16 parts by weight/100 parts by weight of the resin component) of an auxiliary anhydride comprising the adduct of methylcyclopentadiene and maleic anhydride (having a structural formula designated as structural formula (5), above,

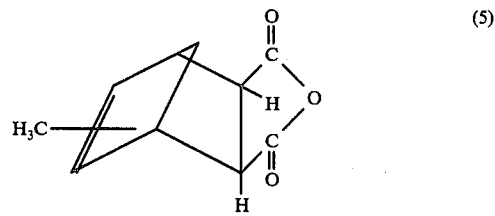

The combined components of resin and curing agent were not heated prior to applying the mixture to the substrate 21. Again the epoxy resin-curing agent coated substrate was heated at 120° C for 30 minutes to attain a fully cured epoxy as evidenced by an infrared spectrum which revealed the disappearance of the anhydride and epoxide functional groups.

A post-bake of 170° C for 30 minutes of the metal-deposited substrate 21 was undertaken.

Peal strengths of 2.6 to 3.7 lbs./linear inch at 0° C, 9 to 10 lbs./linear inch at 25° C and 5 to 7 lbs./linear inch at 90° C were obtained.

EXAMPLE III

The procedure of Example I was repeated except that the resin mixture comprised:

(a) 40 grams (40 parts by weight/100 parts by weight of the resin component) of the adduct of two moles of the diglycidyl ether of bisphenol A having an epoxide equivalent weight of 180 to 195 and one mole of linoleic dimer acid (of Example I);

(b) 30 grams (30 parts by weight/100 parts by weight of the resin component) of an elastomerically modified epoxy resin blend comprising the reaction product resulting from the reaction at 300° F for 30 minutes of (1) 40 weight percent of the carboxyl terminated acrylonitrile/butadiene copolymer of Example I and (2) 60 weight percent of the diglycidyl ether comprising bisphenol F having an epoxide equivalent weight of 152 to 167 (the reaction product of elastomerically modified epoxy resin blend having an epoxide equivalent weight of 285 to 305, an acid value of less than 0.2 milligrams of KOH per one gram of the resultant reaction blend and a viscosity of X-Y [Gardner-Holdt, 80% N.V. in methyl cellosolve]); and (c) 30 grams (30 parts by weight/100 parts by weight of the resin component) of the brominated diglycidyl ether of bisphenol A (of Example II).

The resin mixture was combined with a mixture comprising:

(a) 20 grams (20 parts by weight/100 parts by weight of the resin component) of chlorendic anhydride curing agent;

(b) 10 grams (10 parts by weight/100 parts by weight of the resin component) of the adduct of methylcyclopentadiene and maleic anhydride [of Example II, above] curing agent;

(c) 10 grams (10 parts by weight/100 parts by weight of the resin compound) of citraconic anhydride curing agent;

(d) 1 gram of benzyldimethylamine curing agent accelerator; and (e) 2 grams of antimony trioxide.

The combined components were then directly applied to the substrate 21 and fully cured at 150° C for one hour. The peel strength obtained (after the post bake of the metal-deposited substrate 21 (laminate) was 8 lbs./linear inch at 25° C.

EXAMPLE IV

The procedure of Example I was repeated except that the resin mixture comprised:

(a) 30 grams (28.8 parts by weight/100 parts by weight of the resin component) of the diglycidyl ether of linoleic dimer acid, commercially obtained, and having the structural formula previously described and designated as structural formula (2), above, i.e.,

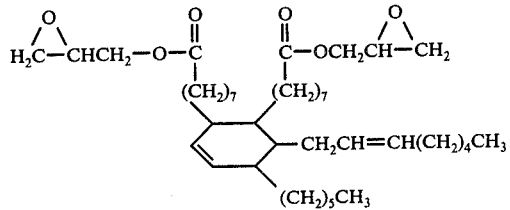

and an epoxide equivalent weight of 400 to 420;

(b) 34 grams (32.7 parts by weight/100 parts by weight of the resin component) of the reaction product (300 F, 30 minutes) of 40% by weight of the carboxyl terminated butadiene/acrylonitrile copolymer and 60% by weight of the diglycidyl ether of bisphenol A having an epoxide equivalent weight of 180 to 195 [of Example I]; and (c) 40 grams (38.5 parts by weight/100 parts by weight of the resin component) of the brominated diglycidyl ether of bisphenol A (of Example II).

The resin mixture component was combined with a mixture comprising:

(a) 25 grams (24 parts by weight/100 parts by weight of the resin component) of chlorendic anhydride curing agent;

(b) 25 grams (24 parts by weight/100 parts by weight of the resin component) of the adduct of methylcyclopentadiene and maleic anhydride [of Example II, above] curing agent; and (c) one gram of a curing agent accelerator, commercially obtained, having the structural formula

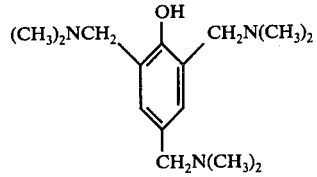

The combined components were then directly applied to the substrate 21 and fully cured at 150° C for 30 minutes. The peel strength obtained (after the post bake of the metal-deposited laminate) was 8 lbs./linear inch at 25° C.

EXAMPLE V

The procedure of Example I was repeated except that the resin component of the mixture comprised the following:

(a) 750 grams (17 parts by weight per 100 parts by weight of the resin component) of the diglycidyl ether of linoleic dimer acid having the structural formula

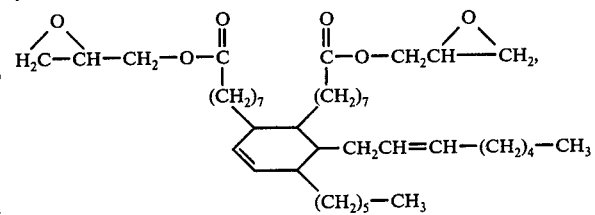

and an epoxide equivalent weight of 400 to 420;

(b) 1250 grams (28.5 parts by weight per 100 parts by weight of the resin component) of the adduct of two moles of the diglycidyl ether of bisphenol A having an epoxide equivalent weight of 180 to 195 and one mole of linoleic dimer acid (of Example I); and (c) 2400 grams (54.5 parts by weight per 100 parts by weight of the resin component) of the brominated diglycidyl ether of bisphenol A (of Example II).

The resin mixture was combined with a mixture comprising:

(a) 1000 grams (22.7 parts by weight per 100 parts by weight of the resin component) of chlorendic anhydride curing agent;

(b) 1000 grams (22.7 parts by weight per 100 parts by weight of the resin component) of the adduct of methylcyclopentadiene and maleic anhydride curing agent (of Example II);

(c) 400 grams (9.1 parts by weight per 100 parts by weight of the resin component) of a carboxyl terminated butadiene/acrylonitrile random copolymer having a structural formula of

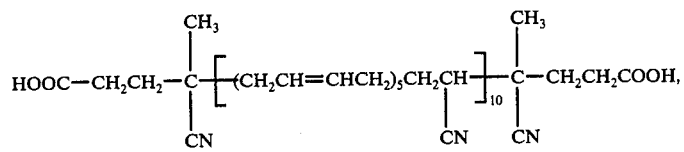

containing 2.37 percent carboxyl groups, 18.8 percent bound acrylonitrile, having a number average molecular weight of 3200 and a viscosity of 110,000 cps at 27° C;

(d) 200 grams (4.5 parts by weight per 100 parts by weight of the resin component) of a carboxyl terminated butadiene/acrylonitrile random copolymer having a structural formula of

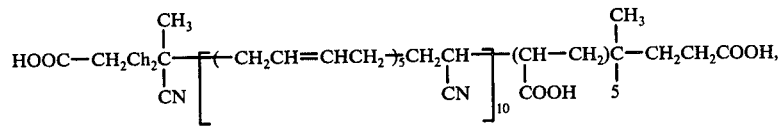

containing 2.93 percent carboxyl groups, 18 to 19 percent bound acrylonitrile, having a number average molecular weight of 3400 and a viscosity of 125,000 cps at 27° C;

(e) 200 grams (4.5 parts by weight per 100 parts by weight of the resin component) of a ground mixture comprising 70 parts by weight of antimony oxide and 30 parts by weight of a butadiene/acrylonitrile copolymer containing 33 percent acrylonitrile and having a specific gravity of 0.98 and an average Mooney viscosity of 80; and (f) 50 grams (1.1 parts by weight per 100 parts by weight of the resin component) of benzyldimethylamine.

The combined components were then applied to and impregnated a glass cloth having a thickness of about 4 mils and cured at 160° C for six minutes and 150° C for 15 minutes to obtain a full cure. The peel strength obtained of the metallized composite, after a 170° C bake for 30 minutes, was 7 to 9 lbs./in. at room temperature.

EXAMPLE VI

The procedure of Example I was repeated except that the resin component mixture comprised the following:

(a) 1000 grams (50 parts by weight per 100 parts by weight of the resin component) of the adduct of two moles of the diglycidyl ether of bisphenol A having an epoxide equivalent weight of 180 to 198 and one mole of linoleic dimer acid (of Example I); and (b) 1000 grams (50 parts by weight per 100 parts by weight of the resin component) of the brominated diglycidyl ether of bisphenol A (of Example II).

The resin component mixture was combined with a mixture comprising:

(a) 500 grams (25 parts by weight per 100 parts by weight of the resin component) of the adduct of methylcyclopentadiene and maleic anhydride (of Example II);

(b) 300 grams (15 parts by weight per 100 parts by weight of the resin component) of chlorendic anhydride;

(c) 240 grams (12 parts by weight per 100 parts by weight of the resin component) of a carboxyl terminated butadiene/acrylonitrile random copolymer having a number average molecular weight of 3200, containing 2.37 percent carboxyl groups and 18 to 19 percent acrylonitrile, having the structural formula

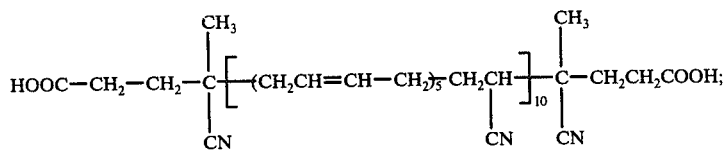

(d) 200 grams (10 parts by weight per 100 parts by weight of the resin component) of the tricarboxylic acid obtained from the trimerization of linoleic acid having a molecular weight of approximately 810 and an acid value of 145 to 185 and a stoichiometry of $C_{54}H_{96}O_6$;

(e) 66 grams (3.3 parts by weight per 100 parts by weight of the resin component) of a paste made by grinding a mixture of 60 parts by weight of antimony oxide and 40 parts by weight of the diglycidyl ether of bisphenol A having an epoxide equivalent weight of 180 to 195; and (f) 20 grams (1.0 part by weight per 100 parts by weight of the resin component) of benzyldimethylamine.

The combined components were applied to and impregnated a glass cloth having a thickness of about 4 mils and cured at 150° C for 20 minutes to give a fully cured composite. The peel strength, obtained after a bake at 170° C for 30 minutes of the resultant copper-epoxy composite was 16 to 20 lbs./in. at room temperature.

EXAMPLE VII

An epoxy resin-amine curing agent solution was prepared in the following manner. One hundred and fifty grams of the adduct of two moles of the diglycidyl ether of bisphenol A having an epoxide equivalent weight of 180 to 195 and one mole of linoleic dimer acid (of Example I) was combined with 6.2 grams of hexanediamine, 50 ml. of xylene and 100 ml. of acetone. A 4 mil thick glass cloth (commercially obtained) was immersed into the solution and allowed to drain. The impregnated or coated cloth was then fully cured at 140° C for one hour. The fully cured epoxy-glass was then metallized as described in Example I and baked at 120° C for 10 minutes. A peel strength measurement of the deposited copper metal (90° peel at two inches per minute) gave a value of 8 lbs./in. at room temperature.

EXAMPLE VIII

A commercially obtained epoxy-glass hardboard was coated, to form a layer 0.5 mil thick, with an epoxy resin-curing agent solution comprising (a) 550 grams of the epoxy resin comprising the adduct of two moles of the diglycidyl ether of bisphenol A having an epoxide equivalent weight of 180 to 195 and one mole of linoleic dimer acid (of Example I), (b) 16.2 grams diethylenetriamine, (c) 150 ml. of xylene and (d) 300 ml. of toluene. The coated epoxy-glass hardboard was allowed to cure under ambient conditions for one day. The cured board was then metallized as described in Example I and then baked at 140° C for one hour. A peel value of 8 lbs./in. was obtained.

EXAMPLE IX

One hundred and fifty grams of the adduct of two moles of the diglycidyl ether of bisphenol A having an epoxide equivalent weight of 180 to 195 and one mole of linoleic dimer acid (of Example I) was combined with (a) 3 grams of diethylenetriamine, (b) 25 grams of a polyoxypropylenediamine having an approximate molecular weight of 1,000 and a structural formula of

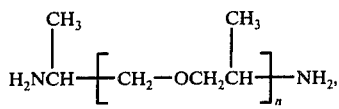

where $n = 15.9$, (c) 50 ml. of xylene, (d) 75 ml. of isophorone and (e) 100 ml. of acetone. A commercially obtained epoxy-glass hardboard was coated with the resultant epoxy resin-curing agent solution to form a layer 2 mil thick. The coated board was allowed to cure at ambient conditions for one day and then metallized as described in Example I. The copper-deposited sample was then baked at 140° C for one hour. A peel strength of 12 lbs./in. was obtained at room temperature.

EXAMPLE X

The procedure of Example IX was repeated except that there was a bake at 140° C for 30 minutes prior to metallization and a bake after metallization of 140° C for one hour. The peel value obtained was 8 lbs./in.

EXAMPLE XI

The procedure of Example I was repeated except that 125 grams of the adduct of two moles of the diglycidyl ether of bisphenol A having an epoxide equivalent weight of 180 to 195 and one mole of linoleic dimer acid (of Example I) was combined with (a) 12.2 grams of a polyoxypropylenetriamine having an approximate molecular weight of 403, having a structural formula

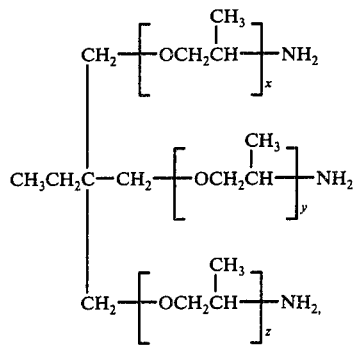

where $x + y + z = 5.3$, and (b) 125 grams of toluene. An epoxy-glass hardboard, commercially obtained, was coated with the resultant solution and cured at 120° C for one hour. The fully cured board was then metallized as described in Example I and baked at 120° C for 10 minutes. The resultant peel value was 7.5 lbs./in. at 25° C.

EXAMPLE XII

The procedure of Example I was repeated except that 75 grams of the adduct of two moles of the diglycidyl ether of bisphenol A having an epoxide equivalent weight of 180 to 195 and one mole of linoleic dimer acid (of Example I) was combined with (a) 25 grams of a reaction mixture (300° F for 30 minutes) comprising (1) 40 parts by weight of a carboxyl terminated butadiene/acrylonitrile copolymer (of Example VI) having a number average molecular weight of 3200, and (2) 60 parts by weight of a diglycidyl ether of bisphenol A having an epoxide equivalent weight of 180 to 195, (b) 12 grams of a polyoxypropylenetriamine (of Example XI), and (c) 25 grams of xylene. An epoxy-glass hardboard was coated with the resultant solution and cured at 120° C for one hour. The fully cured board was then metallized as described in Example I and baked at 170° C for 30 minutes. A peel value of 6 lbs./in. at 25° C was obtained.

EXAMPLE XIII

The procedure of Example I was repeated except that the resin component comprised:

(a) 24 grams of the reaction product (at 300° F for 30 minutes) of (1) 60 weight percent of the diglycidyl ether of bisphenol A having an epoxide equivalent weight of 180 to 195 and (2) 40 weight percent of a carboxyl terminated butadiene/acrylonitrile copolymer (of Example VI) having a number average molecular weight of 3200, and (b) 80 grams of the diglycidyl ether of bisphenol A having an epoxide equivalent weight of 180 to 195.

The resin component was combined with 32 grams of polyoxypropylenetriamine (of Example XI).

The combined components were then coated on an epoxy-glass hardboard, commercially obtained, and cured at 100° C for one hour. The cured board was metallized and then baked at 170° C for 30 minutes. Peel values of 8.8 to 12.5 lbs./in. at 25° C, 7 lbs./in. at 0° C and 3.5 lbs./in. at 90° C were obtained.

EXAMPLE XIV

The procedure of Example XI was repeated except that the resin component comprised:

(a) 50 grams of the reaction product (at 300° F for 30 minutes) of (1) 60 weight percent of the diglycidyl ether of bisphenol A having an epoxide equivalent weight of 180 to 195 and (2) 40 weight percent of the carboxyl terminated butadiene/acrylonitrile copolymer (of Example VI) having a number average molecular weight of 3200; and (b) 50 grams of the diglycidyl ether of tetrabromo bisphenol A having an epoxide equivalent weight of 450 to 500 (of Example II).

The resin component was combined with 13 grams of polyoxypropylenetriamine (of Example XI). The combined components were then coated on the epoxy-glass hardboard and cured at 120° C for 30 minutes. The cured board was metallized and then baked at 170° C for 30 minutes. A peel value of 10 lbs./in. at 25° C was obtained.

It is to be understood that the abovedescribed embodiments are simply illustrative of the principles of the invention. Various other modifications and changes may be made by those skilled in the art which will embody the principles of the invention and fall within the spirit and scope thereof.

What is claimed is:

1. A cured epoxy polymer having improved adhesive properties comprising the reaction product of a mixture comprising:

(1) a resin component comprising, (a) about 25 to about 95 parts by weight per 100 parts by weight of said resin component of a diglycidyl ether based upon linoleic dimer acid selected from the group consisting of (a¹) an adduct of two moles of the diglycidyl ether of bisphenol A and one mole of linoleic dimer acid having a structural formula of

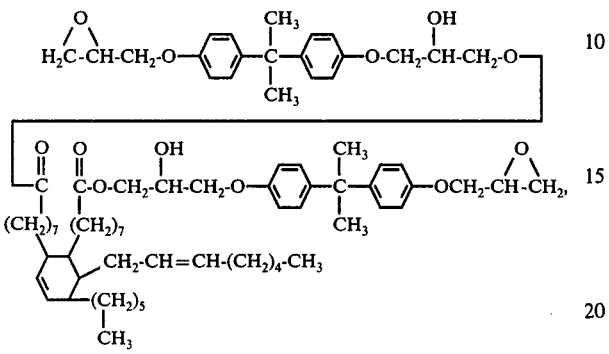

and an epoxide equivalent weight of 650 to 750, (b¹) a diglycidyl ether of linoleic dimer acid having a structural formula of

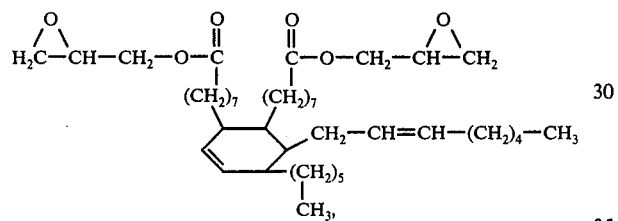

and an epoxide equivalent weight of 400 to 420, and (c¹) a mixture thereof, (b) about 5 to about 50 parts by weight per 100 parts by weight of the resin component of an elastomerically modified epoxy resin blend comprising the reaction product of about 40 weight percent of a carboxyl terminated acrylonitrile/butadiene random copolymer having a structural formula of

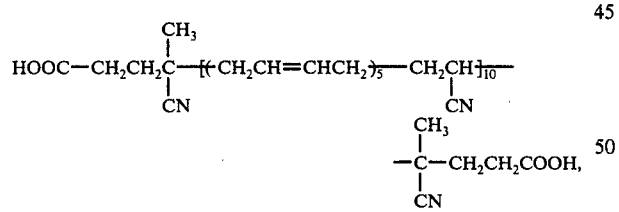

containing 2.37 percent carboxyl groups, 18 to 19 percent bound acrylontrile and having a number average molecular weight of 3200, combined with about 60 weight percent of a diglycidyl ether selected from the group consisting of a diglycidyl ether of bisphenol A having an epoxide equivalent weight of 180 to 195 and a diglycidyl ether of bisphenol F having an epoxide equivalent weight of 152 to 167; and (c) a remainder of a suitable diglycidyl ether selected from the group consisting of a diglycidyl ether of bisphenol A, a diglycidyl ether of bisphenol F or a mixture thereof; and (2) a suitable curing agent selected from (a) an acid anhydride present in an amount ranging from about 16 to about 60 parts by weight per 100 parts by weight of the resin component, (b) a suitable polyamine present in an equal mole-to-mole ratio with the resin component, (c) a mixture comprising said polyamine in (b) above combined with at least 5 parts by weight per 100 parts by weight of the resin component of a suitable acid anhydride, (d) a mixture comprising said acid anhydride in (a) above combined with up to about 30 parts by weight per 100 parts by weight of the resin component of a carboxylic acid selected from the group consisting of dicarboxylic acid having a structural formula of

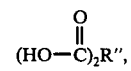

where R'' is an organic radical selected from

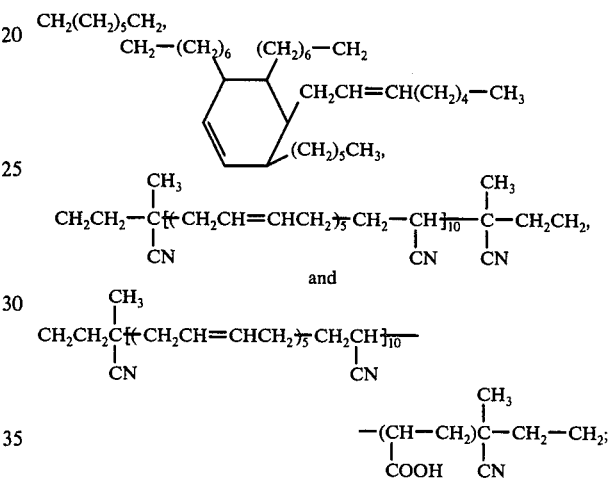

a trimer acid having a stoichiometry of $C_{54}H_{96}O_6$, and a mixture thereof, and (e) a mixture of the foregoing.

2. The cured epoxy as defined in claim 1 wherein said curing agent comprises at least one acid anhydride present in an amount which yields an anhydride-to-epoxide molar ratio of 0.6 to 0.9.

3. The cured epoxy polymer as defined in claim 1 wherein said reaction mixture comprises:
said diglycidyl ether in (a¹) above, present in an amount of about 75 parts by weight per 100 parts by weight of said resin component;
said elastomerically modified epoxy resin blend in (b) above, where said combined diglycidyl ether comprises bisphenol A, present in an amount of about 25 parts by weight per 100 parts by weight of said resin component; and
said curing agent, in (2) (a) above, comprising an anhydride mixture which comprises about 20 parts by weight per 100 parts by weight of said resin component of chlorendic anhydride and about 2.5 parts by weight per 100 parts by weight of said resin component of phthalic anhydride.

4. The cured epoxy polymer as defined in claim 1 wherein said reaction mixture comprises:
said diglycidyl ether in (a¹) above, present in an amount of about 30 parts by weight per 100 parts by weight of said resin component;
said elastomerically modified epoxy resin blend in (b) above, where said combined diglycidyl ether comprises bisphenol A, present in an amount of about 30 parts by weight per 100 parts by weight of said resin component;

said remainder in (c) above, comprising said diglycidyl ether of bisphenol A which comprises about 40 parts by weight per 100 parts by weight of said resin component of a brominated diglycidyl ether of bisphenol A, containing 18 to 20 weight percent of bromine and having an epoxide equivalent weight of 450 to 500; and said curing agent, in (2) (a) above, comprising an anhydride mixture which comprises about 30 parts by weight per 100 parts by weight of said resin component of chlorendic anhydride and about 16 parts by weight per 100 parts by weight of said resin component of the adduct of methylcyclopentadiene and maleic anhydride.

5. The cured epoxy as defined in claim 1 wherein said reaction mixture comprises:

said diglycidyl ether in ($a^1$) above, present in an amount of about 40 parts by weight per 100 parts by weight of said resin component;

said elastomerically modified epoxy resin blend in (b) above, where said combined diglycidyl ether comprises bisphenol F, present in an amount of about 30 parts by weight per 100 parts by weight of said resin component;

said diglycidyl ether, in (c) above, comprising a brominated diglycidyl ether of bisphenol A, containing 18 to 20 weight percent of bromine and having an epoxide equivalent weight of 450 to 500, present in an amount of about 30 parts by weight per 100 parts by weight of said resin component; and said curing agent, in (2) (a) above, comprising an anhydride mixture which comprises about 20 parts by weight per 100 parts by weight of said resin component of chlorendic anhydride, about 10 parts by weight per 100 parts by weight of said resin component of the adduct of methylcyclopentadiene and maleic anhydride, and about 10 parts by weight per 100 parts by weight of said resin component of citraconic anhydride.

6. The cured epoxy as defined in claim 1 wherein said reaction mixture comprises:

said diglycidyl ether in ($b^1$) above, present in an amount of about 28.8 parts by weight per 100 parts by weight of said resin component;

said elastomerically modified epoxy resin blend in (b) above, where said combined diglycidyl ether comprises bisphenol A, present in an amount of about 32.7 parts by weight per 100 parts by weight of said resin component;

said diglycidyl ether of bisphenol A, in (c) above, comprising about 38.5 parts per 100 parts by weight of said resin component of a brominated diglycidyl ether of bisphenol A, containing 18 of bromine 20 weight percent bromine and having an epoxide equivalent weight of 450 to 500; and said curing agent, in (2) (a) above, comprising an anhydride mixture which comprises about 24 parts by weight per 100 parts by weight of said resin component of chlorendic anhydride and about 24 parts by weight per 100 parts by weight of said resin component of the adduct of methylcyclopentadiene and maleic anhydride.

7. A curable epoxy composition comprising a mixture which comprises:

(1) a resin component comprising:

(a) about 25 to about 95 parts by weight per 100 parts by weight of said resin component of a diglycidyl ether based upon linoleic dimer acid selected from the group consisting of ($a^1$) an adduct of two moles of the diglycidyl ether of bisphenol A and one mole of linoleic dimer acid having a structural formula of

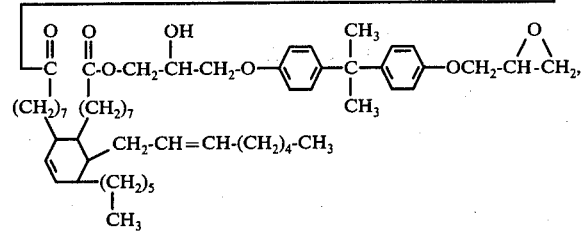

and an epoxide equivalent weight of 650 to 750, ($b^1$) a diglycidyl ether of linoleic dimer acid having a structural formula of

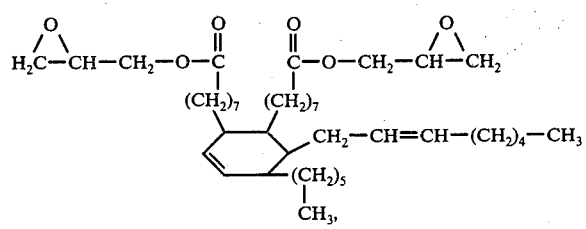

and an epoxide equivalent weight of 400 to 420, and ($c^1$) a mixture thereof, (b) about 5 to about 50 parts by weight per 100 parts by weight of the resin component of an elastomerically modified epoxy resin blend comprising the reaction product of about 40 weight percent of a carboxyl terminated acrylonitrile/butadiene random copolymer having a structural formula of

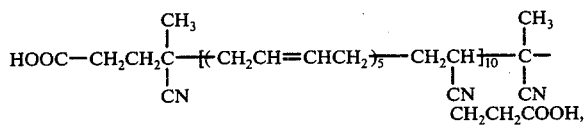

containing 2.37 percent carboxyl groups, 18 to 19 percent bound acrylonitrile and having a number average molecular weight of 3200, combined with about 60 weight percent of a diglycidyl ether selected from the group consisting of a diglycidyl ether of bisphenol A having an epoxide equivalent weight of 180 to 195 and a diglycidyl ether of bisphenol F having an epoxide equivalent weight of 152 to 167; and (c) a remainder of a suitable diglycidyl ether selected from the group consisting of a diglycidyl ether of bisphenol A, a diglycidyl ether of bispenol F or a mixture thereof; and (2) a suitable curing agent selected from (a) an acid anhydride present in an amount ranging from about 16 to about 60 parts by weight per 100 parts by weight of the resin component, (b) a suitable polyamine present in an equal mole-to-mole ratio with the resin component, (c) a mixture comprising said polyamine in (b) above combined with at least 5 parts by weight per 100 parts by weight of the resin component of a suitable acid anhydride, (d) a mixture comprising said acid anhydride in (a) above combined with up to about 30 parts by weight per 100 parts by weight of the resin component of a carboxylic acid selected from the group consisting of a dicarboxylic acid having a structural formula of

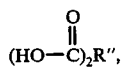

where R'' is an radical selected from

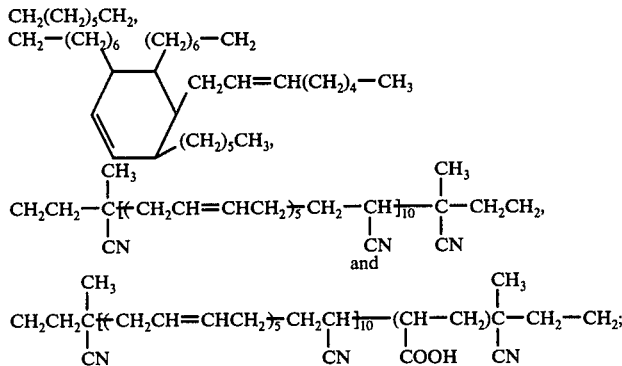

a trimer acid having a stoichiometry of $C_{54}H_{96}O_6$, and a mixture thereof, and (e) a mixture of the foregoing.

8. The composition as defined in claim 7 wherein said curing agent comprises at least one acid anhydride present in an amount which yields an anhydride-to-epoxide molar ratio of 0.6 to 0.9.

9. The composition as defined in claim 7 wherein the mixture comprises:
   said diglycidyl ether in ) ($a^1$)($a^1$) above, present in an amount of about 75 parts by weight per 100 parts by weight of said resin component;
   said elastomerically modified epoxy resin blend in (1) (b) above, where said combined diglycidyl ether comprises bisphenol A, present in an amount of about 25 parts by weight per 100 parts by weight of said resin component; and
   said curing agent, in (2) (a) above, comprising an anhydride mixture which comprises about 20 parts by weight per 100 parts by weight of said resin component of chlorendic anhydride and about 2.5 parts by weight per 100 parts by weight of said resin component of phthalic anhydride.

10. The composition as defined in claim 7 wherein the mixture comprises:
    said diglycidyl ether in ) ($a^1$)($a^1$) above, present in an amount of about 30 parts by weight per 100 parts by weight of said resin component;
    said elastomerically modified epoxy resin blend in (1) (b) above, where said combined diglycidyl ether comprises bisphenol A, present in an amount of about 30 parts by weight per 100 parts by weight of said resin component;
    said remainder in (1) (c) above, comprising said diglycidyl ether of bisphenol A which comprises about 40 parts by weight per 100 parts by weight of said resin component of a brominated diglycidyl ether of bisphenol A, containing 18 to 20 weight percent of bromine and having an epoxide equivalent weight of 450 to 500; and
    said curing agent, in (2) (a) above, comprising an anhydride mixture which comprises about 30 parts by weight per 100 parts by weight of said resin component of chlorendic anhydride and about 16 parts by weight per 100 parts by weight of said resin component of the adduct of methylcyclopentadiene and maleic anhydride.

11. The composition as defined in claim 7 wherein the mixture comprises:
    said diglycidyl ether in (1) ($a^1$) above, present in an amount of about 40 parts by weight per 100 parts by weight of said resin component;
    said elastomerically modified epoxy resin blend in (1) (b) above, where said combined diglycidyl ether comprises bisphenol F, present in an amount of about 30 parts by weight per 100 parts by weight of said resin component;
    said diglycidyl ether, in (1) (c) above, comprising a brominated diglycidyl ether of bisphenol A, containing 18 to 20 weight percent of bromine and having an epoxide equivalent weight of 450 to 500, present in an amount of about 30 parts by weight per 100 parts by weight of said resin component; and
    said curing agent, in (2) (a) above, comprising an anhydride mixture which comprises about 20 parts by weight per 100 parts by weight of said resin component of chlorendic anhydride, about 10 parts by weight per 100 parts by weight of said resin component of the adduct of methylcyclopentadiene and maleic anhydride, and about 10 parts by weight per 100 parts by weight of said resin component of citraconic anhydride.

12. The composition as defined in claim 7 wherein the mixture comprises:
    said diglycidyl ether in (1) ($b^1$) above, present in an amount of about 28.8 parts by weight per 100 parts by weight of said resin component;
    said elastomerically modified epoxy resin blend in (1) (b) above, where said combined diglycidyl ether comprises bisphenol A, present in an amount of about 32.7 parts by weight per 100 parts by weight of said resin component;
    said diglycidyl ether of bisphenol A, in (1) (c) above, comprising about 38.5 parts per 100 parts by weight of said resin component of a brominated diglycidyl ether of bisphenol A, containing 18 to 20 weight percent of bromine and having an epoxide equivalent weight of 450 to 500; and said curing agent, in (2) (a) above, comprising an anhydride mixture which comprises about 24 parts by weight per 100 parts by weight of said resin component of chlorendic anhydride and about 24 parts by weight per 100 parts by weight of said resin component of the adduct of methylcyclopentadiene and maleic anhydride.

* * * * *

Page 1 of 2 Pages

UNITED STATES PATENT OFFICE
CERTIFICATE OF CORRECTION

Patent No. 4,077,927　　　　　　　Dated March 7, 1978

Inventor(s) Charles Allen McPherson

It is certified that error appears in the above-identified patent and that said Letters Patent are hereby corrected as shown below:

In the specification, Column 1, line 37, "appreciable" should read --appreciate--. Column 3, line 7, "conventionl" should read --conventional--; line 59, "board" should read --boards--. Column 4, line 66, "acid (= 25" should read --acid (x = 25--. Column 6, line 8, "printed" should read --printing--. Column 7, line 15, "by weight 100" should read --by weight per 100--; line 67, "bisphenol, P," should read --bisphenol F,--. Column 8, line 29, "product of" should read --product or--. Column 9, line 8, "ranges rom" should read --ranges from--; line 9, "about 5 to" should read --about 5 parts to--. Column 10, line 53, "Madic" should read --Nadic--. Column 11, line 3, "of about 60" should read --to about 60--. Column 12, formula (11), lines 13 through 18, that portion of the formula which reads "($CH_2CN=$"　　　should read　　--($CH_2CH=$--.

Column 17, line 63, "195;" should read --195--. Column 18, line 43, "Peal" should read --Peel--; line 63, "product of" should read --product or--. Column 19, line 14, "compound" should read --component--. Column 20, lines 60 through 66, that portion of the formula which reads "$CH_2)_5$"　　　should read　　--$(CH_2)_5$--.

Column 21, lines 8 through 13, that portion of the formula which reads

"$CH_2Ch_2$"　　　should read　　--$CH_2CH_2$-- same formula, that portion which reads

UNITED STATES PATENT OFFICE
CERTIFICATE OF CORRECTION

Patent No. 4,077,927            Dated March 7, 1978

Inventor(s) Charles Allen McPherson

It is certified that error appears in the above-identified patent and that said Letters Patent are hereby corrected as shown below:

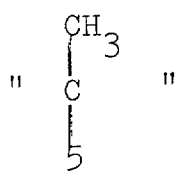   should read   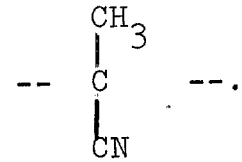

Column 24, line 58, "abovedescribed" should read --above-described--.

In the claims, Column 27, claim 6, lines 56 and 57, "containing 18 of bromine 20 weight percent bromine" should read --containing 18 to 20 weight percent of bromine--. Column 28, claim 7, line 38, "thereof," should read --thereof;--. Column 29, claim 7, line 17, "radical" should read --organic radical--; claim 9, line 41, "ether in ) ($a^1$)($a^1$)" should read --ether in (1)($a^1$)--; claim 10, line 57, "ether in ) ($a^1$)($a^1$)" should read --ether in (1)($a^1$)--.

Signed and Sealed this

Nineteenth Day of September 1978

[SEAL]

Attest:

RUTH C. MASON  
Attesting Officer

DONALD W. BANNER  
Commissioner of Patents and Trademarks